United States Patent

Bergemont et al.

[11] Patent Number: 6,008,508
[45] Date of Patent: Dec. 28, 1999

[54] ESD INPUT PROTECTION USING A FLOATING GATE NEURON MOSFET AS A TUNABLE TRIGGER ELEMENT

[75] Inventors: Albert Bergemont; Min-hwa Chi, both of Palo Alto, Calif.

[73] Assignee: National Semiconductor Corporation, Santa Clara, Calif.

[21] Appl. No.: 08/713,026

[22] Filed: Sep. 12, 1996

[51] Int. Cl.[6] .................................................. H01L 29/06
[52] U.S. Cl. ......................... 257/175; 257/173; 257/174; 257/355; 257/360; 361/20; 361/90; 361/91; 361/118; 361/126; 361/272
[58] Field of Search .................... 257/173–175, 257/355–360; 361/20, 90–92, 118, 126, 200, 272

[56] References Cited

U.S. PATENT DOCUMENTS 5,272,586  12/1993  Yen .......................................... 257/356

OTHER PUBLICATIONS

A. Chatterjee et al., "A Low–Voltage Triggering SCR for On–Chip ESD Protection at Output and Input Pads", IEEE Electron Device Letters, vol. 12, No. 1, Jan. 1991, pp. 21–22.

Shibata et al., "A Functional MOS Transistor Featuring Gate–Level Weighted Sum and Threshold Operations", IEEE Transactions on Electron Devices, vol. 39, No. 6, Jun. 1992, pp. 1444–1455.

M.D. Ker et al., "Complementary–LVTSCR ESD Protection Circuit for Submicron CMOS VLSI/ULSI", IEEE Transactions on Electron Devices, vol. 43, No. 4, Apr. 1996, pp. 588–598.

Primary Examiner—Tom Thomas
Assistant Examiner—Fetsum Abraham
Attorney, Agent, or Firm—Limbach & Limbach LLP

[57] ABSTRACT

Disclosed is a floating gate neuron MOS transistor that may be incorporated into devices such as low voltage silicon control rectifiers for protection of internal circuits against electrostatic discharge. The transistor includes two or more input gates capacitively coupled to the floating gate. By adjusting the coupling ratio of the input gates, it is possible to control the transistor drain turn-on voltage very precisely and thereby turn on the rectifier without relying on avalanche breakdown of the transistor.

9 Claims, 5 Drawing Sheets

ESD INPUT PROTECTION USING A FLOATING GATE NEURON MOSFET AS A TUNABLE TRIGGER ELEMENT

BACKGROUND OF THE INVENTION

1. Field of the Invention

The present invention relates to electrostatic discharge (ESD) protection for integrated circuits, and in particular, to the use of a floating gate neuron MOS transistor for electrostatic discharge protection.

2. Description of the Related Art

With the down-scaling of CMOS transistors, the gate oxide may be as thin as 100 Å or less. The high impedance node at the input may be easily charged by electrostatic charges to as high as 2000 V (of either positive or negative polarity) during handling. As a result, gate oxide on the discharge path of scaled down CMOS devices connected to the input node can be destroyed or damaged to cause subsequent failure early in the operating life of the device.

Input and output circuit terminals are designed with protection networks on the chip that provide a path for ESD and prevent the generation of excessive voltage across the gate oxide of the devices. One state-of-the-art gate protection network utilizes the parasitic SCR (Silicon Control Rectifier) device which can be fabricated using CMOS technology. In its "on" state, the SCR provides excellent protection for sensitive devices because its "on" resistance is low and the electrostatic charge can be quickly discharged with heat dissipation over a large volume. One way to trigger conventional SCR devices is using the current generated during "avalanch" breakdown of the n-well to p-substrate junction by applying sufficient voltage across the pnpn path in the SCR device.

However, some particularly sensitive devices may be damaged at voltages less than the SCR trigger voltage ($V_{trig}$). Therefore, the SCR alone is useless for protecting these devices. For example, if $V_{trig}$ is around 30 V, the gate-oxide breakdown voltage and drain breakdown voltage of a MOS transistor in a 0.5 μ device (120 Å gate oxide) are both less than 15 V. If the SCR is to provide protection against ESD at an input or output pad, then its $V_{trig}$ should be less than the drain breakdown voltage of the NMOS device at the output buffer or the gate-oxide breakdown voltage at the input pads.

A Low-Voltage Triggering SCR (LVTSCR) structure has been developed for ESD protection of submicron CMOS devices. These LVTSCR reportedly have trigger voltages that are lower than the gate-oxide breakdown voltage (the gate oxide breakdown field is ≈8×10⁶ V/cm) and the drain breakdown voltage of MOS transistors. As shown in FIG. 1, in a LVTSCR, an NMOS structure is incorporated into the SCR as a device for triggering SCR at low-voltage. In this structure, the drain device trigger voltage $V_{trig}$ is determined by the snap-back breakdown voltage of the incorporated NMOS device. The drain of the NMOS device is connected to the n-well of the pnpn path of the SCR device; the gate and the source are both tied to $V_{ss}$. As a result, high voltage generated from the pad during an ESD event brings the NMOS device into snap-back breakdown at a lower voltage than the SCR structure. If the channel length of the MOS transistor in LVTSCR is smaller than 0.5 μ, then the drain breakdown of the NMOS occurs at lower voltage; in turn, the SCR is triggered at lower voltage for the circuit. The equivalent circuits for two popular LVTSCR are shown in FIG. 1. In one LVTSCR, the pad is shorted to the n-well in the associated SCR path and has a higher trigger current; in the other LVTSCR, the pad is not shortened to the n-well. In the former, when the pad is zapped to high voltage, the snap-back current in the n-channel MOS initially forward biases the pnp bipolar device (Qp) and then the npn bipolar device (Qn), and finally the SCR path enters into latch-up mode. The positive ESD charge is then quickly removed through the SCR path without damaging internal circuits. The n-channel MOS serves the function of providing triggering current in order to trigger the SCR path into the "on" state. It is well known that the triggering current is larger when the n-well is shorted to the pad.

Similarly, a complementary LVTSCR structure incorporating a PMOS transistor is useful for protection against a negative ESD zap, as described by Ker, et al., "Complementary LVTSCR ESD Protection Circuit for Submicron CMOS VLSI/ULSI," IEEE Trans. Electron Devices, Vol. 43, No. 4, p. 588–598, 1996. When the pad is zapped to low voltage, the snap-back current in the p-channel MOS initially forward biases the npn bipolar (Qn) and then the pnp bipolar (Qp), and finally the SCR path enters into latch-up mode. The negative ESD charge is then quickly removed through the SCR path without damaging internal circuits. Again, the p-channel MOS serves the function of providing latch-up triggering current for the SCR path. The case when the n-well is shorted to $V_{dd}$ requires larger latch-up triggering current and hence requires a larger p-channel MOS transistor in the LVTSCR structure.

Several opportunities for improvements remain in conventional devices for ESD protection. First, since $V_{trig}$ is sensitive to process variations (such as channel length), it is desirable to enhance photolithographic technologies to print channel lengths of MOS transistors in LVTSCR structure that are smaller than the minimum feature size capability of the technique. Second, the snap-back breakdown voltage of the MOS transistors in LVTSCR varies with the channel length, and the effects of hot carrier generation during an ESD zap event. Third, it is desirable to be able to tune $V_{trig}$ without resort to changing the channel length of the MOS in LVTSCR devices. Finally, it is desirable to trigger the SCR device without the MOS transistor operating in breakdown.

Accordingly it is desirable to modify conventional MOS transistors in LVTSCR devices, so that $V_{trig}$ is controlled by the turn-on voltage of a floating gate MOS transistor by proper gate coupling to the floating-gate transistor.

SUMMARY OF THE INVENTION

The present invention solves these and other problems by providing a floating-gate MOS transistor for an LVTSCR. In devices according to the present invention, it is possible to control $V_{trig}$ as a function of turn-on voltage of the floating-gate MOS transistor. Devices according to the present invention include a double poly floating-gate MOS transistor with two inputs. By adjusting the coupling ratio of the two gates, it is possible to control the turn-on voltage and hence the SCR triggering voltage very precisely.

MOS transistors of the present invention can be used advantageously as a triggering element in LVTSCR devices for several reasons. Trigger voltage may be controlled by proper design of the gate coupling ratio in the MOS transistor; thus, the floating gate transistor is turned on at a relatively low voltage during an ESD event and therefore avoids transistor breakdown as the device trigger. The triggering current is generated by the turn-on, rather than by avalanche breakdown, of the MOS transistor. As a result, the trigger voltage is less sensitive to process variations and effects of hot carriers generated during drain breakdown.

The presence and relatively larger size of the control gate facilitates monitoring of the condition of the path via feedback. The transistor can be designed to respond to relatively higher or lower voltages at the input and output pads, depending on design requisites.

BRIEF DESCRIPTION OF THE DRAWINGS

The present invention will be described with reference to the drawings of the following Figures in which.

DESCRIPTION OF THE INVENTION

Generally, devices according to the present invention are floating gate MOS transistors that may be incorporated into low voltage trigger silicon control rectifier (LVTSCR) devices for protecting internal circuits from electrostatic discharges. The floating gate MOS transistors serve as trigger elements to turn on the SCR.

Although the present invention is exemplified for convenience with a floating gate neuron MOSFET having two control gates, MOSFETs having three, four or more control gates are considered within the scope of the present invention. It is contemplated that these latter MOSFET configurations will be useful in connecting the same floating gate neuron transistor to more than one pad so that many internal circuits can be protected by a single transistor according to the present invention.

Figure 1:
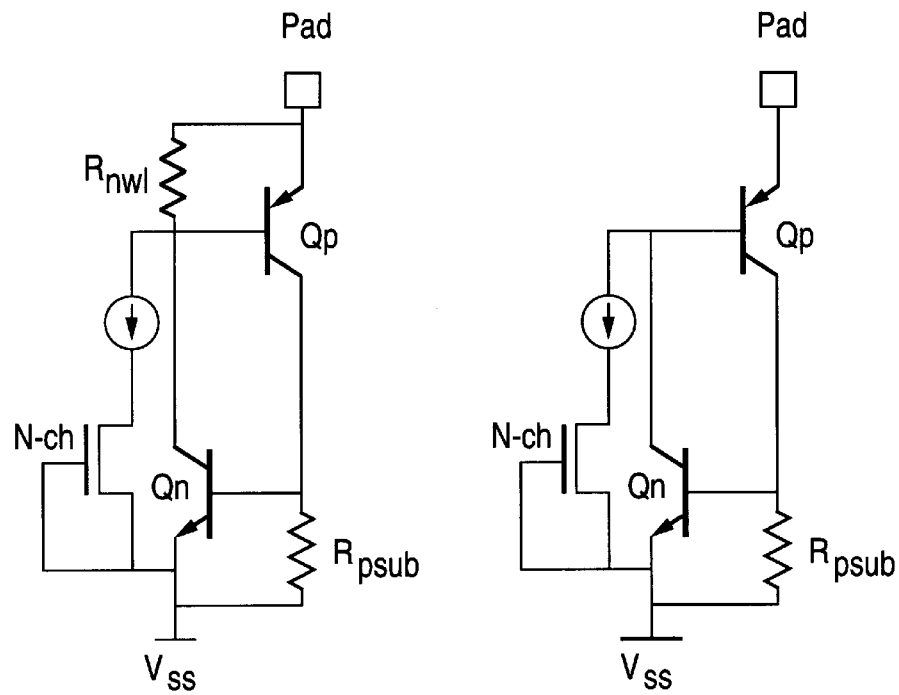
FIGS. 1 and 2 illustrate conventional LVTSCR devices.
Figure 2:
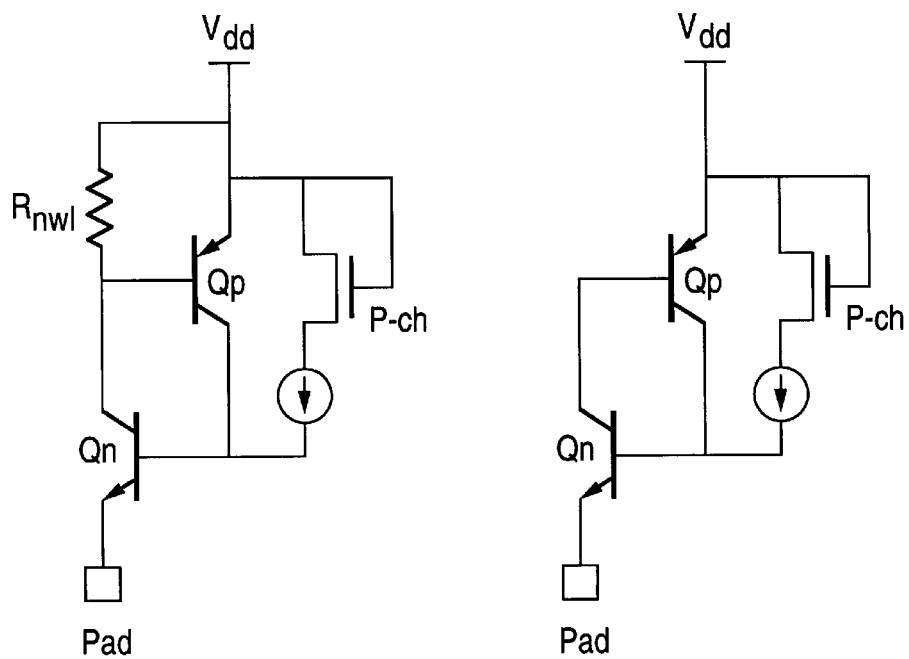
Figure 3:
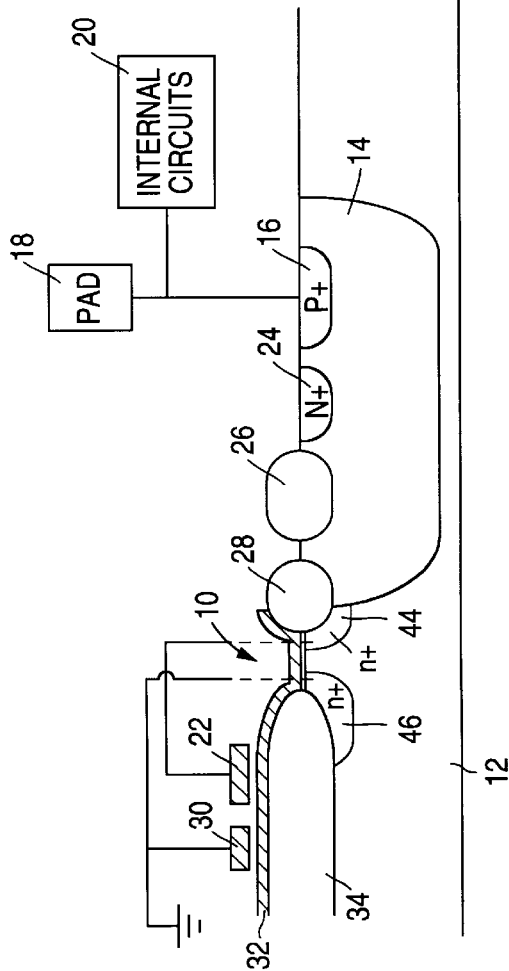
FIGS. 3, 4A and 4B illustrate cross sectional views of a low voltage trigger silicon control rectifier device having tunable dual floating gate MOS transistors (n-channel) according to the present invention.
Figure 4A:
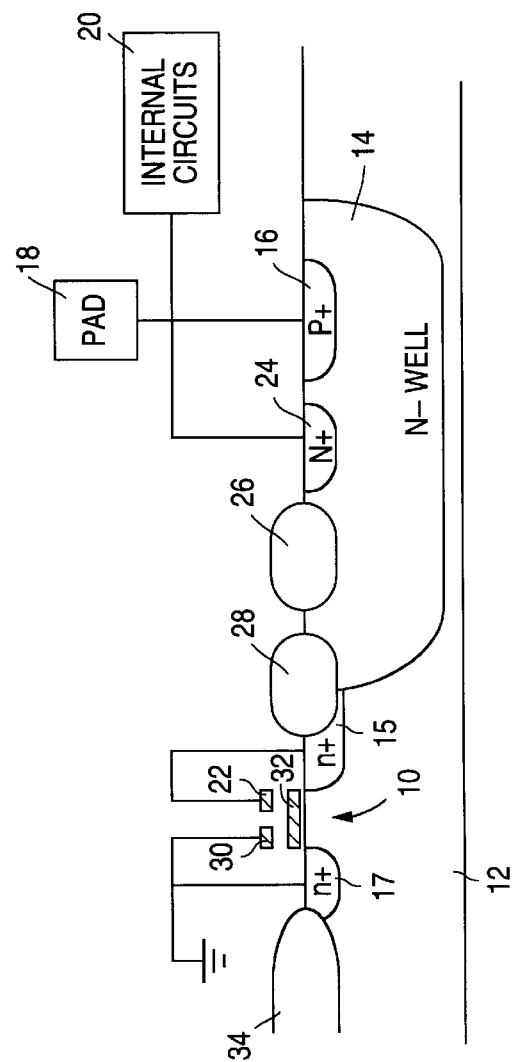
Figure 4B:
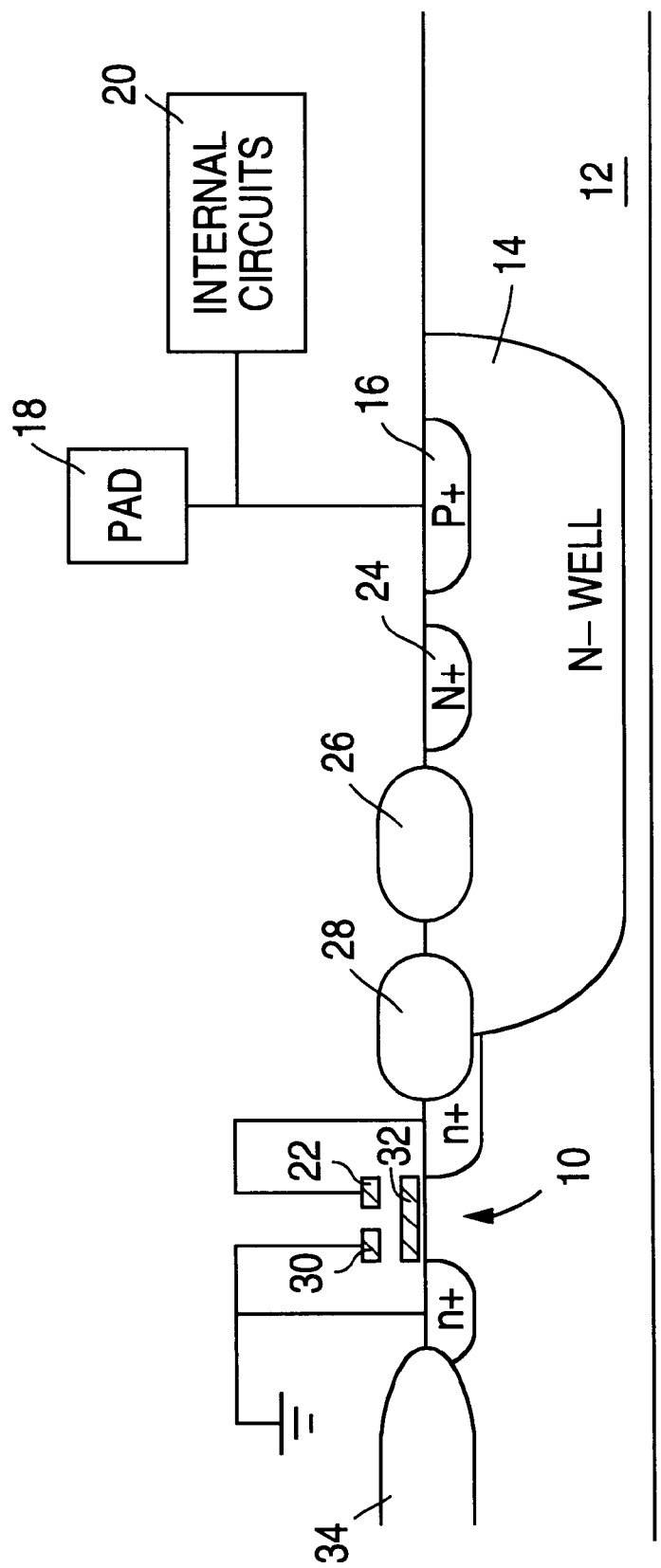
Figures 5A, 5B:
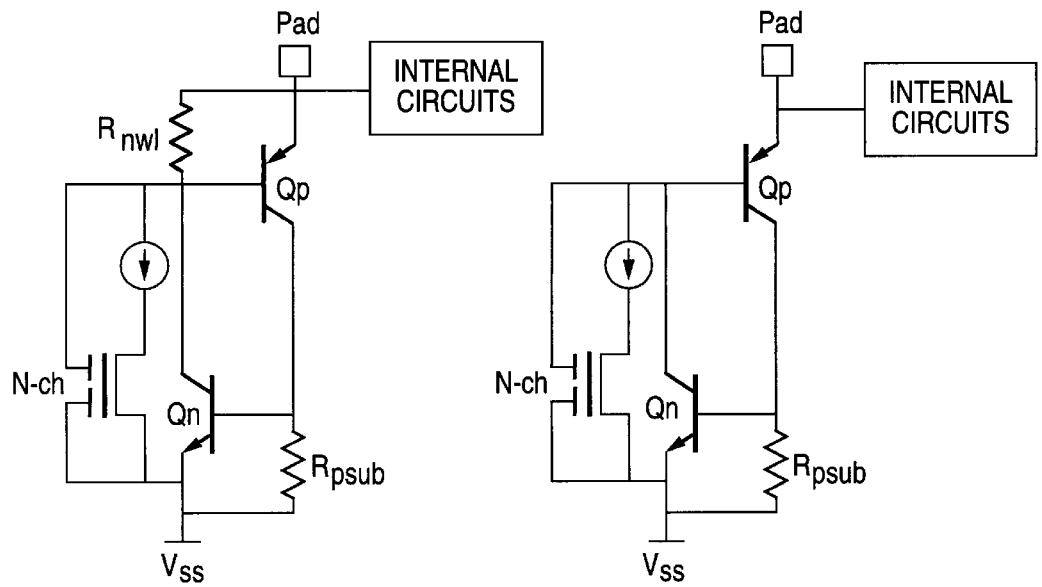
FIG. 5A illustrates the circuit equivalent of the floating gate MOS transistor shown in FIG. 4A.
FIG. 5B illustrates the circuit equivalent of the floating gate MOS transistor shown in FIGS. 3 and 4B.

The present invention will be described first with reference to FIGS. 3–5B. As shown in the exemplary cross sectional view of the device structure of FIG. 3, an n-channel MOS transistor 10 is formed on a p-substrate 12, adjacent to an n-well 14. The drain 1744 of n-channel MOS transistor 10 is connected to n-well 14 (FIGS. 3, 4A and 4B). The input pad 18 is connected to the p+ contact 16 in n-well 14 and to internal circuits 20 to be protected from ESD. Gate 22 and n+ contact 24 in n-well 14 are connected together via drain 44. Gate 30 and the source 46 of NMOS transistor 10 are connected to $V_{ss}$ ground. Field oxide regions 26 and 28 are also formed in n-well 14. Gates 22 and 30 are capacitively coupled to floating gate 32 and overlie field oxide region 34. Gate 30 is grounded. Gates 22 and 30 may be composed of polysilicon, metal or a polycide. Gate 32 is composed of polysilicon.

MOS transistor 10 is turned on when the floating gate potential reaches the desired threshold voltage (viewed from the floating gate). The potential at the floating gate, $V_{fg}$, is related to the potentials at gate 22, $V_1$, and at gate 30, $V_2$, by the following relationship:

$$V_{fg} = V_1 w_1 + V_2 w_2 \qquad (1)$$

where $w_1$ and $w_2$, gate coupling ratios, are defined as the ratios of the capacitance of the respective gates to the total capacitance (viewed from the floating-gate 32). The sum $w_1 + w_2$ is approximately equal to about 1, if stray capacitances (viewed from the floating gate) are smaller than the capacitances from gate 22 and gate 30.

Since gate 30 is grounded and gate 22 is connected to drain 44, Equation 1 becomes $$V_{fg} = V_d w_1 \qquad (2)$$

The NMOS can be turned-on when $V_{fg}$ approaches $V_t$ (the threshold voltage viewed from the floating-gate); and in turn, the SCR device is triggered after the NMOS is turned on. The drain turn-on voltage can thus be estimated from equation 2, i.e., $V_{dON=Vt/w1}$, where $V_t$ is the threshold voltage. Thus, by using at least two control gates and varying the coupling ratios of these gates, $w_1$ and $w_2$, e.g., between about 0.1 and 0.8, one can tune the voltage trigger sufficient to turn on the pnpn path between the pf contact 16, n-well 14, p-substrate 12 and the n+ source 15 of n-channel MOS transistor 10. Increasing the surface area of a gate or reducing the dielectric thickness of a control gate increases the associated coupling ratio.

An example of how the floating gate neuron MOSFETs according to the present invention function to protect internal circuits follows.

Until an ESD event occurs, $V_{ss}$ is substantially at ground. At the beginning of the ESD event, the pad potential increases rapidly, e.g., to about 7 volts, the maximum potential desired at the pad. (This maximum pad potential may be designed by adjusting $w_1$.) The n-channel transistor responds almost immediately by turning on and passing a trigger current from the pnpn path which becomes highly conductive. More specifically, when the potential at the pad is positive, gate 22 (the first control gate) senses the potential at the n-well. As soon as the potential at the n-well is high enough, the potentials at the first control gate and at the floating gate (because of gate coupling) increase sufficiently to turn on the transistor. Current flows from the n-well to $V_{ss}$ through p-substrate and n+ source. This current triggers the pnpn path (between the n+ source of the n-channel transistor 10, p-substrate 12, n-well 14 and source 16) into a highly conductive state. The role of the second control gate (i.e., gate 30), connected to $V_{ss}$ (ground) is to ensure a specific (low) coupling ratio for the first control gate. The second control gate permits control of the coupling ratio (and therefore the drain turn-on voltage) and triggering of the floating gate neuron MOSFET at desirably low voltages. In this way, in MOS transistors according to the present invention, the pnpn path becomes highly conductive before the pad potential exceeds a certain voltage (e.g., ~7 V.) Therefore, the gate oxide and the drain of internal CMOS circuits are protected from damage or degradation.

The transistor "resets" itself to its "off" state after all charge due to the ESD event is dissipated by the lack of current. At this moment, the SCR device is reset to its "off" state.

Figures 8A, 8B:
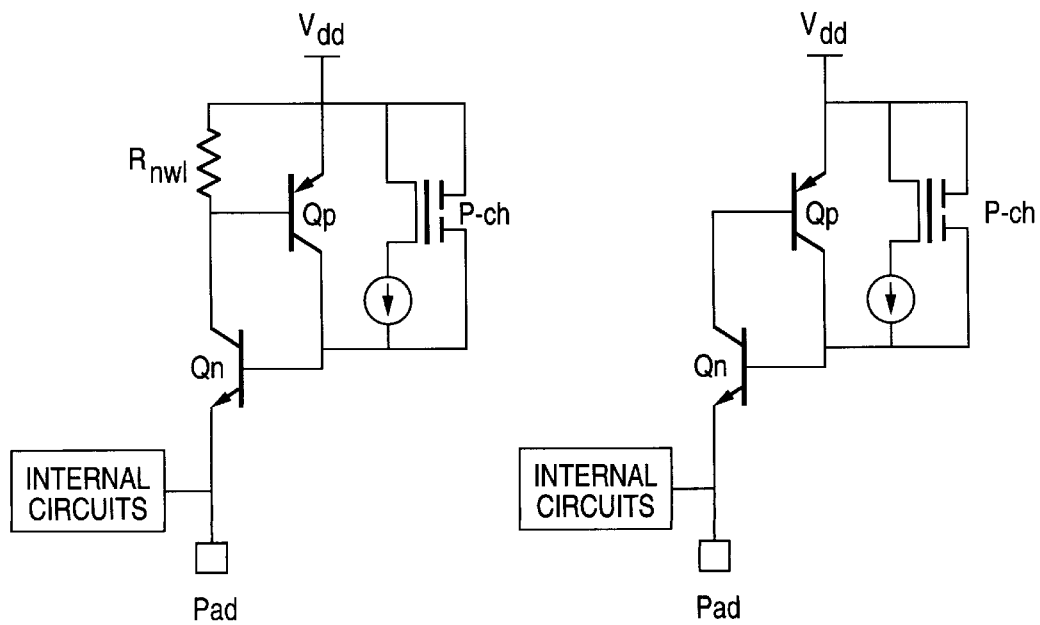
FIG. 8A illustrates the circuit equivalent of a p-channel floating gate MOS transistor according to the present invention.
FIG. 8B illustrates the circuit equivalent of the cross sectional view of the p-channel MOS transistors shown in FIGS. 6 and 7.
Figure 6:
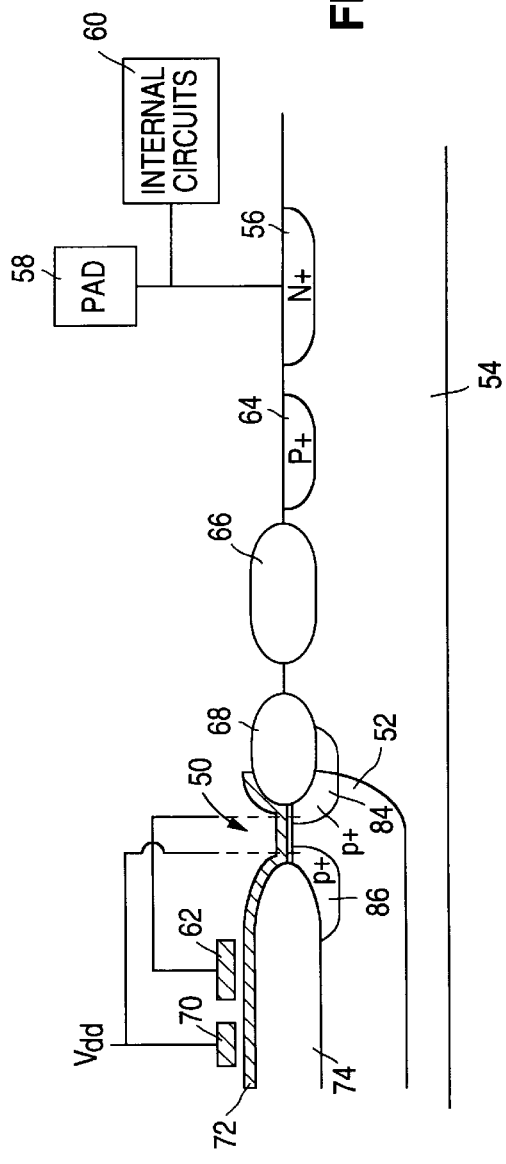
FIGS. 6 and 7 illustrate cross sectional views of complementary p-channel floating gate MOS transistors according to the present invention.
Figure 7:
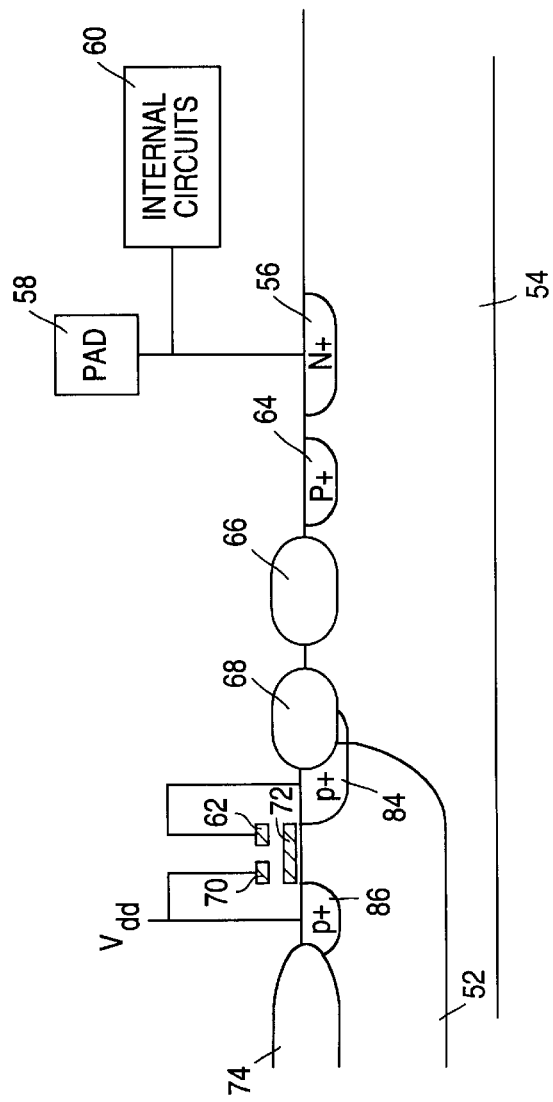

FIGS. 6 and 7 illustrate cross sectional views of a complementary LVTSCR with a p-channel floating gate MOS transistor according to the present invention. FIG. 8 illustrates the circuit equivalent of the structure shown in FIG. 6. A p-channel MOS transistor 50 is formed over an n-well 52 in a p-substrate 54. The p+ drain of the p-channel MOS transistor 50 is connected to p-substrate 54. The input pad 58 is connected to n$^+$ junction 56 to p-substrate and to internal circuits 60 to be protected from ESD. Gate 62 and p⁺-substrate contact 64 are connected to each other. Field oxide regions 66 and 68 are also formed in n-well 52. Two input or "control" gates 62 and 70 are capacitively coupled to floating gate 72 and overlie field oxide region 74. Gate 70 is connected to V$_{dd}$. Gates 62 and 70 may be composed of polysilicon, metal or a polycide.

P-channel MOS transistor 50 is used to protect circuits from negative electrostatic charges at the pad. Thus, both n-channel MOS transistor 10 and p-channel transistor 50 are used together to protect circuits from positive and negative electrostatic charges. More particularly, in response to a positive ESD event, p-channel MOS transistor 50 operates in a similar fashion to n-channel MOS transistor 10. The pnpn path between V$_{dd}$ and the pad 18 is triggered when the floating gate potential reaches the desired threshold voltage (viewed from the floating gate).

While the present invention is disclosed by reference to the preferred embodiments and examples detailed above, it is to be understood that these examples are intended in an illustrative rather than limiting sense, as it is contemplated that many modifications within the scope and spirit of the invention will readily occur to those skilled in the art and the appended claims are intended to cover such variations.

We claim:

1. A floating gate MOS transistor for triggering a silicon control rectifier into an "ON" state upon an electrostatic discharge at a node of a circuit to be protected without placing the MOS transistor into a breakdown state, the floating gate MOS transistor comprising:

a source region of a predetermined conductivity type;

a drain region of the predetermined conductivity type;

a channel between the source and drain regions;

a floating gate disposed above and insulated from the channel region;

a first gate capacitively coupled to the floating gate with a capacitive coupling ratio of w₁, the first gate being in electrical communication with the node via an electrical path that includes the drain region; and a second gate electrically connected to the source region and capacitively coupled to the floating gate with a capacitive coupling ratio of W₂;

wherein the capacitive coupling between the floating gate, first gate, and second gate fulfills the relationship $$V_{fg} = V_1 w_1 + V_2 w_2$$

where V$_{fg}$ is the potential at the floating gate, V$_1$ is the potential at the first gate and V$_2$ is the potential at the second gate;

whereby upon an electrostatic discharge of a predetermined discharge potential at the node, V$_1$ is increased, due to the first gate's electrical communication with the node, to a first gate potential that is sufficient to increase V$_{fg}$ to a floating gate potential that turns on the floating gate MOS transistor, thereby triggering said silicon control rectifier into an "ON" state without placing the floating gate MOS transistor into a breakdown state.

2. The floating gate MOS transistor of claim 1, wherein w$_1$ and w$_2$ are individually between 0.1 and 0.8.

3. The floating gate MOS transistor of claim 1 wherein the predetermined conductivity type is n-type.

4. The floating gate MOS transistor of claim 1 wherein triggering said silicon control rectifier into an "ON" state involves triggering a pnpn path of the silicon control rectifier.

5. The floating gate MOS transistor of claim 1 wherein the predetermined conductivity type is p-type.

6. The floating gate MOS transistor of claim 5 wherein triggering said silicon control rectifier into an "ON" state involves triggering a pnpn path of the silicon control rectifier.

7. The floating gate MOS transistor of claim 1 wherein the first and second gates are fabricated of polysilicon.

8. The floating gate MOS transistor of claim 1 wherein the first and second gates are fabricated of metals.

9. The floating gate MOS transistor of claim 1 wherein the first and second gates are fabricated of polycides.

* * * * *